United States Patent [19]
Starewicz et al.

[11] Patent Number: 5,313,164
[45] Date of Patent: May 17, 1994

[54] APPARATUS FOR MAPPING STATIC MAGNETIC FIELDS

[75] Inventors: Piotr M. Starewicz, North Plainfield, N.J.; David Hillenbrand, Groveland, Mass.

[73] Assignee: Resonance Research Inc., Billerica, Mass.

[21] Appl. No.: 982,481

[22] Filed: Nov. 27, 1992

[51] Int. Cl.$^5$ .............................................. G01R 33/20
[52] U.S. Cl. ...................................... 324/318; 324/322
[58] Field of Search ............... 324/300, 307, 309, 310, 324/311, 312, 313, 314, 318, 319, 322; 128/653.5

[56] References Cited

U.S. PATENT DOCUMENTS

| | | | |
|---|---|---|---|
| 4,717,877 | 1/1988 | Taicher et al. | 324/303 |
| 4,862,087 | 8/1989 | Hillenbrand et al. | 324/320 |
| 4,949,044 | 8/1990 | Starewicz | 324/320 |
| 5,136,243 | 8/1992 | Starewicz et al. | 324/318 |

Primary Examiner—Michael J. Tokar
Attorney, Agent, or Firm—Paul J. Cook

[57] ABSTRACT

Apparatus for mapping a static magnetic field is provided. An NMR-suitable sample or array of samples is positioned in a magnetic field probe adapted to generate an alternating magnetic field and for measuring an induced signal from the sample as a result of being exposed to the alternating magnetic field. The induced signal from the sample is measured at discrete points along a helispherical or heliellipsoidal path located within the static magnetic field. Shim coils can be positioned within the static magnetic field and the current directed to the coils can be controlled as a result of the field mapping results in order to homogenize the static magnetic field. Ferromagnetic elements can be inserted in appropriate locations instead of, or in addition to, the shim coils. One such probe or any array of such probes are mounted on an actuator mechanism, which mechanism moves the probe or array of probes along a helispherical or heliellipsoidal path located within the static magnetic field. Induced signals are acquired from each probe at each of the positions along the path of the mechanism.

9 Claims, 4 Drawing Sheets

APPARATUS FOR MAPPING STATIC MAGNETIC FIELDS

BACKGROUND OF THE INVENTION

This invention relates to a method and apparatus for mapping magnetic fields such as in permanent or electro-magnets of resistive or superconducting design either alone or in conjunction with gradient coil assemblies associated with such magnets.

Nuclear magnetic resonance (NMR) is the resonance effect of an alternating magnetic field at right angles to a static magnetic field to change the orientation of nuclear magnetic polarization moments within a sample within the static magnetic field. The alternating magnetic field generally is applied as the magnetic component of a radio frequency field which can be applied in a continuous manner over a frequency range or which can be applied as pulses at a fixed frequency. The applied magnetic field causes an induced signal from the sample which signal is uniquely characteristic for a given nucleus and magnetic field strength. In order for the measured induced nuclear magnetism to accurately reflect the characteristic of the nuclear sample, it is essential that the static magnetic field be relatively homogeneous over the sample volume.

The use of currents in coils of varying geometry to establish magnetic field uniformly (homogeneity) is an established practice.

It is also established practise to use ferromagnetic elements inside or outside of the magnet bore in combination with shim coils or alone.

At the present time mapping of the magnetic field in a solenoidal geometry such as in NMR apparatus is conducted either by mechanical movement or NMR imaging. In mechanical movement, a single NMR probe or an array of such probes containing a sample which is small in comparison to the rate of variation of the field over the sample volume but large enough to afford sensible signal to noise, is moved mechanically through the volume of interest within the magnet. Typical trajectories of sample movement have been along the field axis of the void volume within the magnet and about circles in planes perpendicular to the field axis of the magnet. This method requires excess data in that two experiments are required which results in an excessive time to obtain the required data and is mechanically more complicated.

To date utilizing mechanical movement required manual operation and an inordinate time period to effect the mapping and also required a technician be present to record and access each reading.

A second presently utilized method is used in magnetic resonance imaging (MRI) based on pixel-by pixel observation of phase of the signal produced by a large uniform phantom. This technique has been found to be useful down to 0.1 ppm at the low fields used in imaging. However, a large frequency distribution of the signal due to field variation over the volume of interest within the magnet renders this method applicable for fine tuning only. Interpretation ambiguities and instrumental complexities also render this method unattractive for mapping highly inhomogeneous magnets.

Up to the present time, the most accurate and convenient method and apparatus for mapping a static magnetic field is disclosed in U.S. Pat. No. 4,949,044. A liquid sample is mounted on a probe adapted to generate an alternating magnetic field. The alternating magnetic field effects an individual signal from the sample. The sample is moved along a helical path at discrete locations within the static magnetic field and the induced signals at the discrete locations are recorded. As disclosed in this patent, the helical path is formed on a cylindrical surface by virtue of the apparatus disclosed to move the probe. While this method provides substantial advantages over the alternative prior art methods and is significantly simple to effect, the use of a helicylindrical path does not provide the most accurate means for defining the volume of the homogenous magnetic field. This is because the homogeneous magnetic field is most often spherical or ellipsoidal in shape, and the mathematical expression to which the map is fit during analysis involves functions (the spherical harmonics or ellipsoidal harmonics) that are properly orthogonal on the surface of the sphere and not on the surface of a cylinder.

U.S. Pat. No. 4,902,975 discloses a D.C. motor useful for moving capacitor plates in a tomography apparatus (MRI).

Routine mapping applications require several hundred separate measurements at precisely fixed positions. It would be desirable to provide a means for mapping a magnetic field which eliminates the need for a skilled technician to be present. Automatic acquisition requires a computer controlled positioning device that does not perturb the field being measured.

SUMMARY OF THE INVENTION

In accordance with this invention, there is provided an apparatus for mapping a static magnetic field suitable for use with an apparatus for homogenizing a static magnetic field over a substantial volume, very large with respect to the volume of the analytical sample of the mapping apparatus and roughly comparable to the size of the volume mapped by the apparatus. An NMR probe or array of probes is mounted on a magnetic field mapper. The probe or probe array is moved to discrete positions along a path which is helispherical or heliellipsoidal within the static magnetic field so that gradients of the z-direction magnetic field can be measured over a desired volume. The measured gradients as determined from analysis of the resulting map then can be utilized to determine current to be directed to radial and axial shim coils or to determine the positions and masses of ferromagnetic pieces used as field control elements positioned within the static magnetic field in order to homogenize the static magnetic field to any order required of the spherical (or ellipsoidal) harmonic field expansion of the static magnetic field. Means are provided for direct control of the current to the shim coils as a function of the induced signal measured. By utilizing the apparatus of this invention wherein measurements are taken along a helispherical or heliellipsoidal path rather than a helicylindrical or an axial path or in a plurality of parallel radial paths, homogenization of a static magnetic field can be achieved efficiently and accurately. When shim coils are used with direct control of the currents in them by the control and analysis computer, the process of improving the homogeneity of the field can be fully automated by mapping analysis and current control adjustment cycles. Positioning of NMR probes is effected by either a remotely positioned stepper motor of a parasitic motor closely coupled to the magnet operating either as a stepping motor or as a D C motor.

DESCRIPTION OF SPECIFIC EMBODIMENTS

Figure 1:
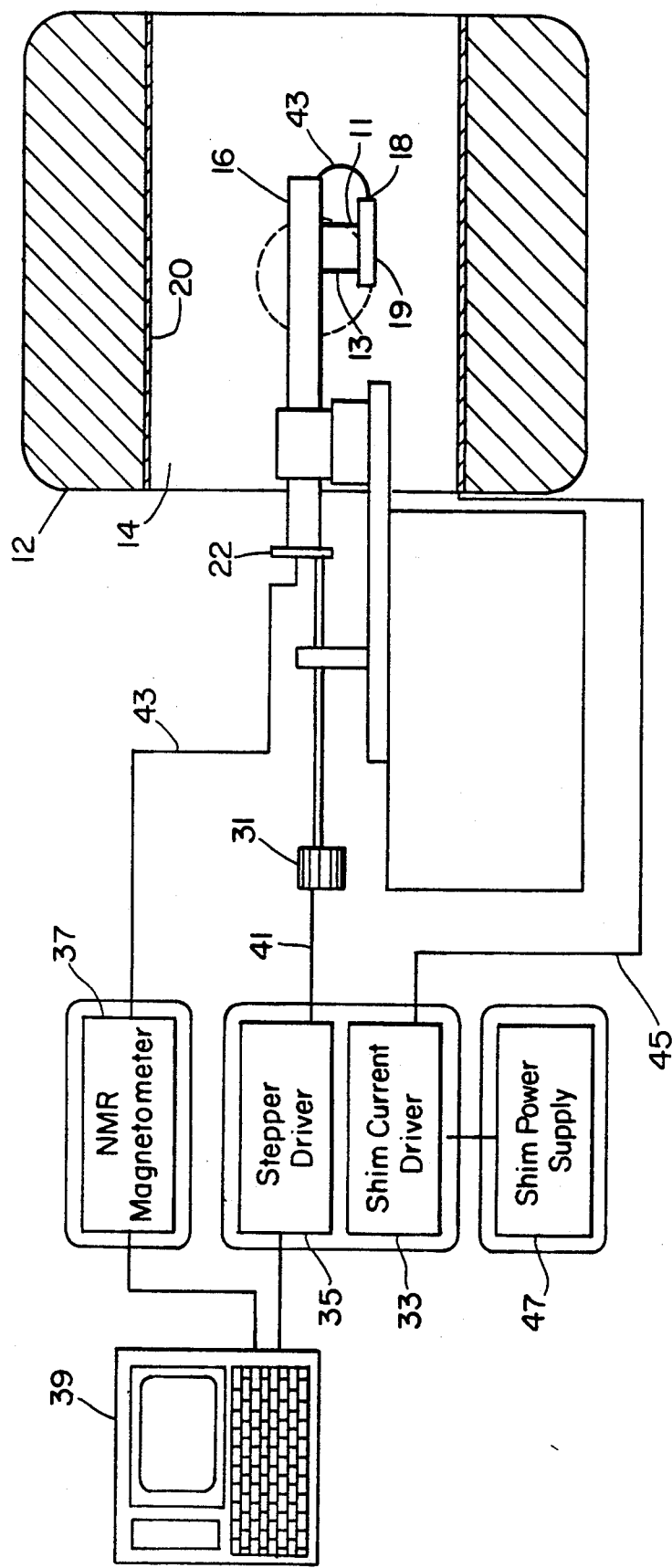
FIG. 1 is a block diagram of an apparatus utilizing this invention.

The present invention will be described specifically herein in terms of mapping a static magnetic field of an NMR apparatus. However, it is to be understood that this invention is useful in any apparatus utilizing a static magnetic field in which mapping of the magnetic field is desirable.

In the NMR apparatus, a relatively large volume of a homogeneous static magnetic field is provided by utilizing a variety of field control elements such as radial and axial coils positioned within the magnet, and/or ferromagnetic control elements.

The character of the z-directional magnetic field in the central volume of a magnet can be described as:

$$B_z(r,\theta,\phi) = \sum_{\substack{n=1 \\ m=0}}^{\inf. n} ((n+m) \, r^{n-1} \, P^m_{n-1}(\cos\theta) \, (A_{nm}\cos m\phi + B_{nm}\sin e\,\phi))).$$

In this spherical harmonic functions expansion, $r$, $\theta$ and $\phi$ are spatial coordinates of position within the central field volume. A defining limitation on the size of this central volume is that it may not include any current-carrying wire or ferromagnetic element of the structures that surround and determine the field.

The A's and B's express the strength of the various terms in the expansion. In the analysis of an experimental map of an unknown field, these are unknowns that are varied to fit the expansion to the field as expressed in the map. In the design of magnetic components, these contain the integrated effects of the field sources, summed over the sources in any particular assembly. This applies both to field sources that are current carriers such as resistive or superconducting coils or to ferromagnetic masses.

The terms of the expansion themselves are the shifts in the field at location $r$, $\theta$, and $\phi$ that the individual inhomogeneity contributions represented by the expansion make.

What is done in mapping and analysis is to sample the field in the central volume over enough points appropriately placed to determine precisely, accurately and independently as many of the spherical or ellipsoidal harmonic coefficients as is practical.

The character of any shim coil can be determined individually by mapping the field with and without the presence of sufficient current passing through the shim coil, and subtracting the two maps. Analysis of the resulting difference map then gives the strength of the gradient contributions to the field from that assembly per unit current.

Differential mapping can also be used to determine the effects of arrays of ferromagnetic pieces placed within, but outside the central volume, of the field.

The effects of current in shim coil arrays and of arrays of ferromagnetic arrays can also be predicted by calculation by application of electromagnetic theory.

Knowledge of the amount of a desired gradient of the field produced by any shim coil per unit current or of any ferromagnetic piece per unit mass and knowledge of the strength of the gradient present as impurity in the field then permits calculation of the amount of current in a particular coil assembly or of mass in a particular piece for adjustment of the homogeneity of the magnetic field.

In the present invention with an NMR apparatus, for example, mapping of the static magnetic field is effected by utilizing a radio frequency (RF) probe and an NMR suitable sample which are inserted into the room temperature bore of the magnet to obtain magnetic field measurements at varying positions along a helispherical or heliellipsoidal path within the magnetic field. The magnetic field measurements are obtained at varying positions within the bore on both sides of the theoretical zero point of the static magnetic field by making the measurements at discrete points along a helispherical or heliellipsoidal path in the bore. Typically, for the example of superconductive, solenoidal MRI magnet measurements are taken at a radius extending from the axial center of the bore and at evenly or unevenly spaced longitudinal angles about the circumference of the bore, e.g., at 3° intervals at 10 to 25 cm radius from the axial center along a helispherical path surrounding the static magnetic field center. Generally, the parameters of the helix utilized in the apparatus of this invention are between about 1 and 60 degrees and longitudinal to polar ratios between 10 and 100. When utilizing lower ratios, the distance between discrete points is sufficiently small as to cause undesirable under-sampling. When the pitch is higher, excessive amounts of data are generated. Generally, shorter axial distances between measurements are effected at the ends of the sphere or ellipsoid as compared to the distance between measurements at a central portion of the sphere or ellipsoid.

In the process of this invention, mapping is effected by positioning an RF probe and an NMR-suitable sample within the bore of a magnet and securing the probe and sample to an apparatus which causes the probe and sample to move along a helispherical or heliellipsoidal path within the bore. In this context, NMR-suitable means that the resonance signal frequency provided by the NMR measurement can be determined with sufficient precision that its imprecision of determination is small relative to the range of changes in signal frequency obtained by positioning the sample being measured at the collection of positions used in determining the map "NMR-suitable" then may be determined by the quality and volume and physical conditions of the magnet environment being mapped and may include low viscosity liquids (such as water or silicone oil), high viscosity liquids or semi-solids (such as silicone polymers), solids (such as $Al_2O_3$), or gases (tetramethylsilane). The NMR-active nucleus could be proton or, as in $Al_2O_3$, [27] Aluminum. A motor such as a stepping motor or a pneumatic motor which permits movement of the probe and sample between discrete points along the helispherical or heliellipsoidal path is provided. The motor is controlled and monitored by a computer suitably programmed to cause the probe and sample to move between discrete points within a short time. Commensurate with the movement of the probe and sample, a computer driven frequency synthesizer is provided to generate a suitable radio frequency which is directed to the probe through a modulator/demodulator which functions to alternately direct power to the radio frequency probe or to prevent power from reaching the frequency probe so that the NMR measurements of the sample can be obtained. In addition, means are provided to effect the measurement of the induced signal from the sample at each discrete point, which signal is directed to the computer so as to correlate the induced signal with position of the sample within the magnet bore.

Mapping the open room temperature bore has advantages in that it utilizes a clear observable to determine a number of gradients and produces a set of current settings that is substantially independent of operator skill. This procedure establishes the field independently of the probe and object under investigation that will be used in experimental work subsequently so that small changes in the current setting must be introduced to compensate approximately for this non-zero susceptibility. However, this is not a problem since the advantage is that the field settings decouple the results from the probe and if a subsequently used probe provides anomalous values, the operator knows that the probe is anomalous and not the magnetic field.

Figure 2:
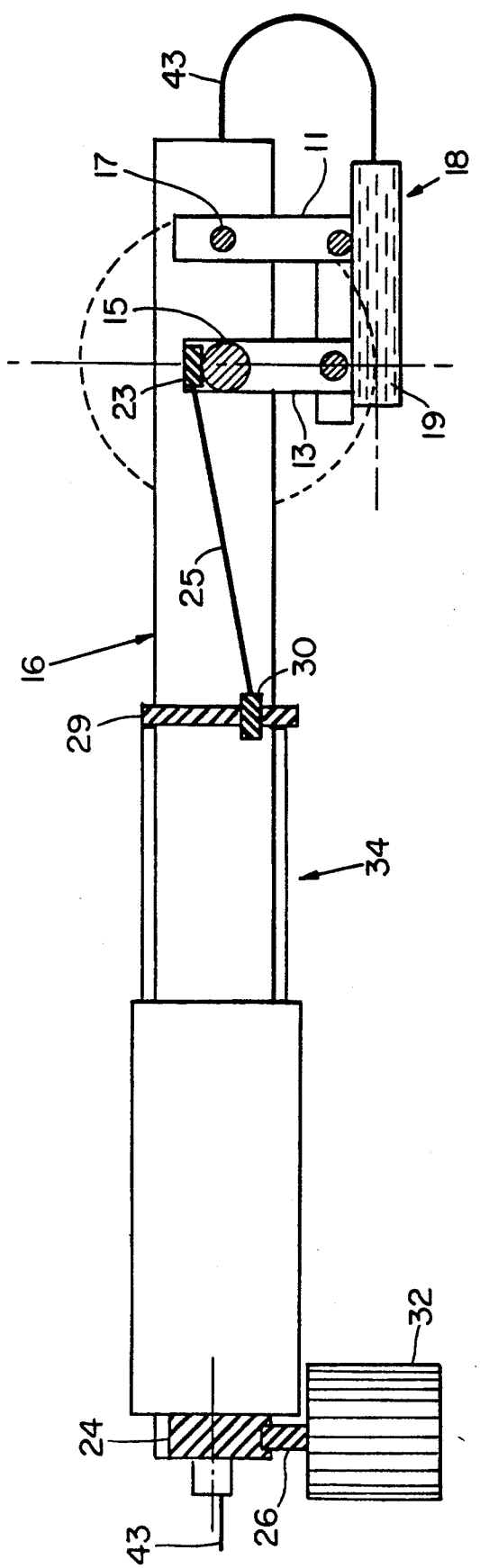
FIG. 2 illustrates the internals of the helispherical mechanism of this invention.

Referring to FIGS. 1 and 2, the mapping system 10 includes a high field magnet 12 having a bore 14 into which is positioned a cylinder 20 on which are mounted radial magnetic coils and axial coils. A probe 18 containing liquid sample 19 is positioned within bore 14 and is mounted on pivotable arms 11 and 13. Arm 13 in turn is mounted on pivot 15. Arm 11 is mounted on pivot 17. Pivot 15 is mounted on an axis parallel to the central axis of cylindrical shaft 16. Arm 13 is connected to worm gear 23, which, in turn is connected to arm 25, gear 30 and stationery worm-toothed gear 29 fixedly mounted on support 34. Shaft 16 is connected to stepper motor 31 in FIG. 1 or passive stepper motor 32 in FIG. 2 via worm 26 and worm gear 24. In the case of stepper motor 51, the drive is applied to shaft 16 through gearbox 22. The induced signal from the sample 19 is passed through cable 43 and is detected by NMR magnetometer 37 and passed to computer 39. Computer 39 activates stepping motor 31 or passive stepper motor 32 through stepper driver 35 by electrical signals passed over cable 41. The stepper motor in turn, provides controlled rotation of shaft 16. As shaft 16 rotates, the probe follows a helispherical or heliellipsoidal path governed by gears 23, 30 and 29. Computer 39 also adjusts shim currents in shim tube 20 by controlling shim current drive 33, whose currents are supplied by shim power supply 47.

Figure 3:
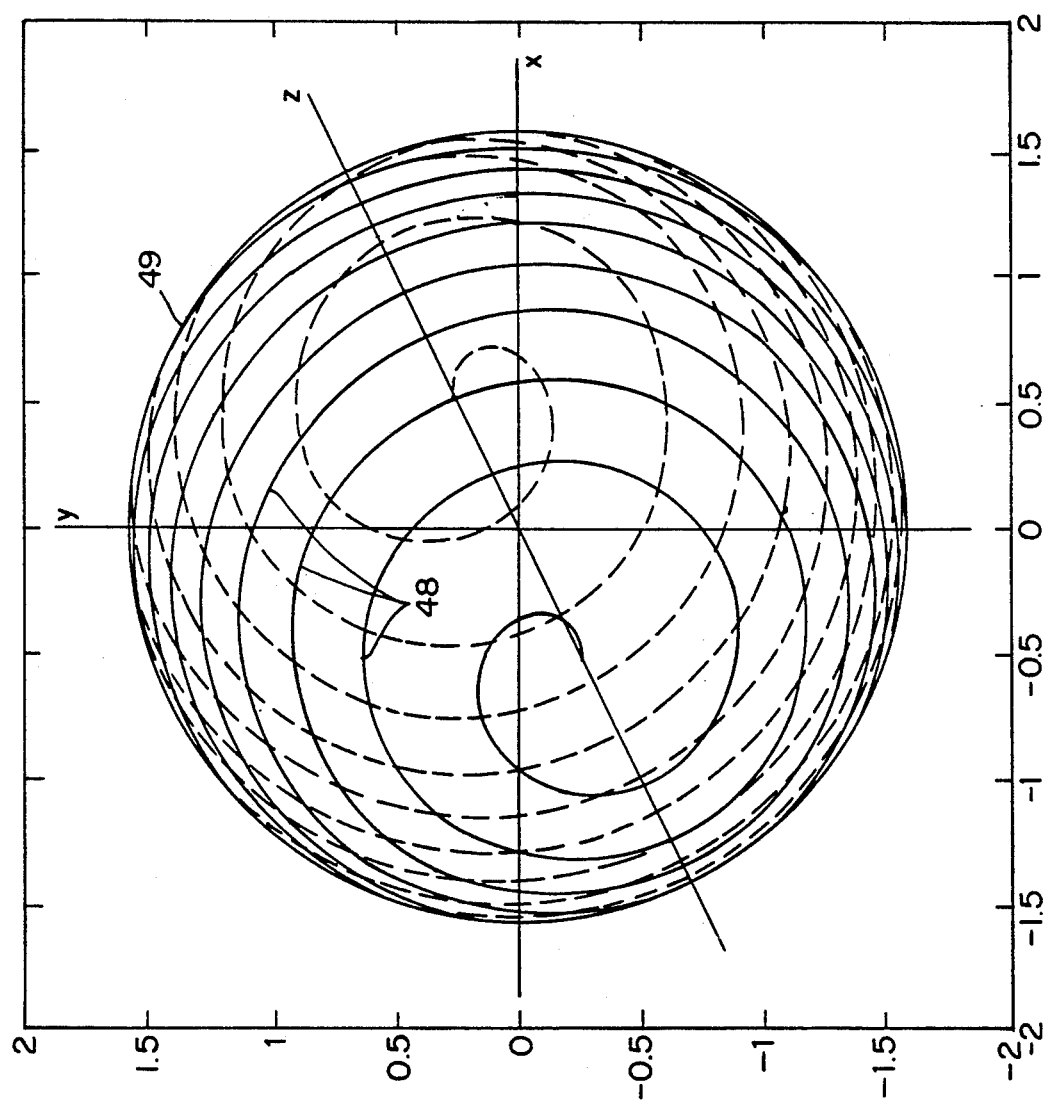
FIG. 3 illustrates a helispherical path taken by the probe of this invention.

Referring to FIG. 3, the helical path 48 on sphere 49 having an x, y and z axis is illustrated. The sample measurements can be taken at even or uneven spaced points along helical path 48.

Figure 4A:
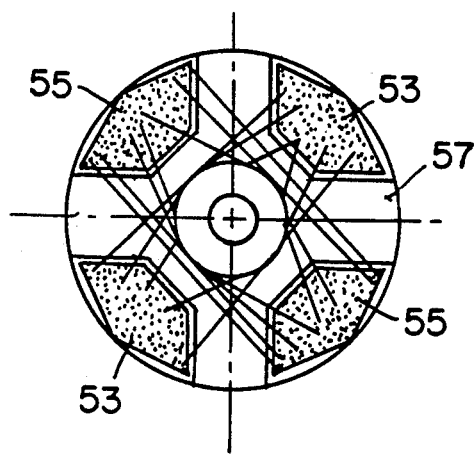
FIG. 4A is a side view of a stepping motor useful in this invention.
Figure 4B:
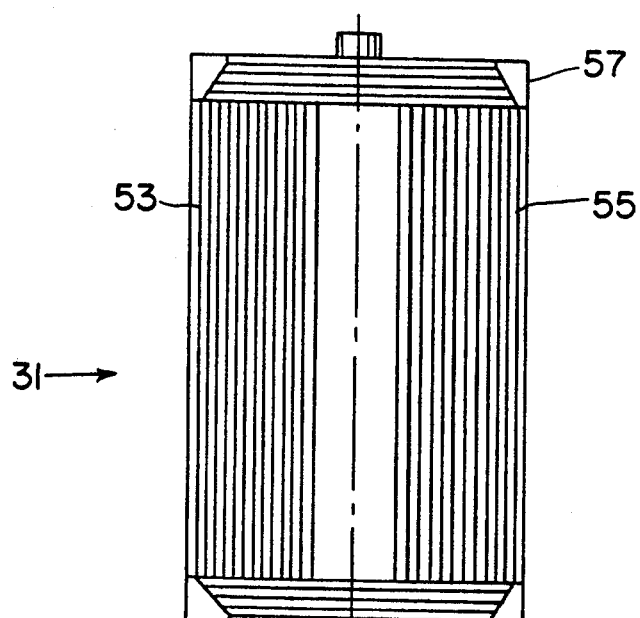
FIG. 4B is a crossectional view of the motor of FIG. 4A taken along line 4B—4B.

Referring to FIGS. 4A and 4B, a passive stepping motor 50 is illustrated which is free of magnets and which utilizes the magnetic field of magnet 12 to effect movement of the shaft 16 and the mapping assembly. The stepping motor 32 includes two sets of metal wire windings 53 and 55. The insulated wire windings are mounted on aluminum former 57. The carbon brushes 59 contact copper rings 61 which are mounted on insulator 61. Motor 32 is activated by current through multistranded cable 65 which passes current to two sets of windings 53 and 55 connected to carbon brushes 59. The ratio of the currents in wire 53 and 55 control the passive stepping motor 32 to control the degree of relation of shaft 16 and therefore, the helispherical or heliellipsoidal position of sample 19. A helispherical path is obtained when arms 11 and 13 are of equal length. An absolute position encoder can be attached to the motor shaft.

We claim:

1. Apparatus for mapping a static magnetic field generated by a static magnet which comprises:
   at least one sample of non-zero nuclear spin mounted on a magnetic field probe adapted to generate an alternating magnetic field and for measuring an induced signal from said sample, said signal being generated by said alternating magnetic field,
   means for generating said alternating magnetic field,
   means for moving said sample to discrete locations along a helispherical or heliellipsoidal path within said static magnetic field, and
   means for recording said induced signal from said discrete locations.

2. The apparatus of claim 1 including a plurality of said samples moved simultaneously.

3. Apparatus for homogenizing a static magnetic field generated by a static magnet which comprises:
   at least one sample of non-zero nuclear spin mounted on a magnetic field probe adapted to generate an alternating magnetic field and for measuring an induced signal from said sample, said induced signal being generated by said alternating magnetic field,
   means for generating said alternating magnetic field,
   means to zero out the spherical or elliptical harmonic expansion of gradient of said static magnetic field,
   means for moving said sample to discrete locations along a helispherical or heliellipsoidal path within said static magnetic field, and
   means for supplying current to the means to zero out spherical or elliptical harmonic expansion of the gradient in order to zero out said gradients in response to said induced signal.

4. The apparatus of claim 1 wherein said helispherical or heliellipsoidal path has a pitch of between about 1 and 60 degrees per longitudinal rotation with the longitudinal to polar ratio between 10 and 100.

5. The apparatus of claim 2 wherein said helispherical or heliellipsoidal path has a pitch of between about 1 and 60 degrees per rotation with the longitudinal to polar ratio between 10 and 100.

6. The apparatus of claim 2 wherein said helispherical or heliellipsoidal path has a pitch of between about 1 and 60 degrees per rotation with the longitudinal to polar ratio between 10 and 100.

7. The apparatus of claim 1 wherein said means for moving said sample includes a stepping motor free of magnetic material having a motor comprising a plurality of electrically conducting coils and means for controlling the ratio of current to said coils thereby to control the degree of rotation of said rotor, said stepping motor being disposed in said static magnetic field so that said static magnetic field functions as a stator field for rotating said rotor.

8. The apparatus of claim 2 wherein said means for moving said sample includes a stepping motor free of magnetic material having a motor comprising a plurality of electrically conducting coils and means for controlling the ratio of current to said coils thereby to control the degree of rotation of said rotor, said stepping motor being disposed in said static magnetic field so that said static magnetic field functions as a stator field for rotating said rotor.

9. The apparatus of claim 3 wherein said means for moving said sample includes a stepping motor free of magnetic material having a motor comprising a plurality of electrically conducting coils and means for controlling the ratio of current to said coils thereby to control the degree of rotation of said rotor, said stepping motor being disposed in said static magnetic field so that said static magnetic field functions as a stator field for rotating said rotor.

* * * * *